(12) United States Patent
Moon et al.

(10) Patent No.: US 8,872,351 B2
(45) Date of Patent: Oct. 28, 2014

(54) SEMICONDUCTOR DEVICES HAVING THROUGH ELECTRODES

(71) Applicant: Samsung Electronics Co., Ltd., Gyeonggi-do (KR)

(72) Inventors: Kwangjin Moon, Hwaseong-si (KR); SuKyoung Kim, Suwon-si (KR); Kunsang Park, Hwaseong-si (KR); Byung Lyul Park, Seoul (KR); Sukchul Bang, Yongin-si (KR); Jin Ho An, Seoul (KR); Kyu-Ha Lee, Yongin-si (KR); Dosun Lee, Gwangju (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/756,833

(22) Filed: Feb. 1, 2013

(65) Prior Publication Data

US 2013/0200526 A1 Aug. 8, 2013

(30) Foreign Application Priority Data

Feb. 2, 2012 (KR) .................. 10-2012-0010921

(51) Int. Cl.
*H01L 23/48* (2006.01)
*H01L 23/52* (2006.01)
(Continued)

(52) U.S. Cl.
CPC . *H01L 23/49827* (2013.01); *H01L 2224/16225* (2013.01); *H01L 23/3128* (2013.01); *H01L 2224/0557* (2013.01); *H01L 2225/06513* (2013.01); *H01L 2225/06565* (2013.01); *H01L 23/481* (2013.01); *H01L 2224/05567* (2013.01); *H01L 2224/13022* (2013.01); *H01L 24/13* (2013.01); *H01L 2225/06544* (2013.01); *H01L 2224/16145* (2013.01); *H01L 2924/15311* (2013.01); *H01L 21/76898* (2013.01); *H01L 21/76831* (2013.01); *H01L 2225/06517* (2013.01); *H01L 25/0657* (2013.01)
USPC .......... 257/774; 257/730; 257/731; 257/733; 257/778; 257/782; 257/786

(58) Field of Classification Search
CPC ............... H01L 23/5226; H01L 33/62; H01L 21/02107; H01L 23/481; H01L 21/76898; H01L 2224/16
USPC .......... 257/774, 730, 731, 733, 778, 782, 786
See application file for complete search history.

(56) References Cited

U.S. PATENT DOCUMENTS 7,843,064 B2 * 11/2010 Kuo et al. ................ 257/758
2009/0321796 A1  12/2009 Inohara
(Continued)

FOREIGN PATENT DOCUMENTS

JP  2008-085126  4/2008
JP  2009-094230  4/2009
(Continued)

*Primary Examiner* — Matthew Reames
*Assistant Examiner* — Dilinh Nguyen
(74) *Attorney, Agent, or Firm* — Myers Bigel Sibley & Sajovec, P.A.

(57) ABSTRACT

Provided are semiconductor devices with a through electrode and methods of fabricating the same. The methods may include forming a via hole at least partially penetrating a substrate, the via hole having an entrance provided on a top surface of the substrate, forming a via-insulating layer to cover conformally an inner surface of the via hole, forming a buffer layer on the via-insulating layer to cover conformally the via hole provided with the via-insulating layer, the buffer layer being formed of a material whose shrinkability is superior to the via-insulating layer, forming a through electrode to fill the via hole provided with the buffer layer, and recessing a bottom surface of the substrate to expose the through electrode.

6 Claims, 20 Drawing Sheets

(51) Int. Cl.
*H01L 29/40* (2006.01)
*H01L 23/04* (2006.01)
*H01L 23/12* (2006.01)
*H01L 23/498* (2006.01)
*H01L 23/00* (2006.01)
*H01L 21/768* (2006.01)
*H01L 23/31* (2006.01)
*H01L 25/065* (2006.01)

(56) References Cited

U.S. PATENT DOCUMENTS

2010/0190338 A1    7/2010   Koike et al.
2010/0193954 A1    8/2010   Liu et al.
2011/0304057 A1   12/2011   Matsumoto
2012/0181617 A1*   7/2012   Luo et al. .................... 257/369

FOREIGN PATENT DOCUMENTS

| | | |
|---|---|---|
| JP | 2009-094235 | 4/2009 |
| JP | 2010-205990 | 9/2010 |
| KR | 100879191 B1 | 1/2009 |
| KR | 1020100030024 A | 3/2010 |

\* cited by examiner

SEMICONDUCTOR DEVICES HAVING THROUGH ELECTRODES

CROSS-REFERENCE TO RELATED APPLICATIONS

This U.S. non-provisional patent application claims priority under 35 U.S.C. §119 to Korean Patent Application No. 10-2012-0010921, filed on Feb. 2, 2012, in the Korean Intellectual Property Office, the entire contents of which are hereby incorporated by reference.

FIELD OF THE INVENTION

Embodiments of the inventive concepts relate generally to semiconductor devices, and more particularly, to semiconductor devices having through electrodes and to methods of fabricating the same.

BACKGROUND OF THE INVENTION

In the semiconductor industry, there has been suggested a through electrode or a through-silicon via (TSV) technology for replacing wire bonding technology. The through electrode technology is realized generally using a through electrode, which is formed to penetrate a semiconductor substrate, and generally, may be classified into a via-last scheme, which is configured to form the through electrode after forming integrated circuits and metal interconnection lines, and a via-middle scheme, which is configured to form the through electrode after forming the integrated circuits but before forming the metal interconnection lines. For the via-middle scheme, the metal interconnection lines may be formed under a relatively high temperature condition after the formation of the through electrode, and thus, the resulting thermal stress may lead to an upward expansion or extrusion of the through electrode. This extrusion of the through electrode may result in a delamination of the metal interconnection line being in contact with the through electrode or an increase in interfacial resistance between the through electrode and the metal interconnection line. The via-last scheme may present the same technical difficulty.

SUMMARY

Embodiments of the inventive concepts provide a semiconductor device, which is configured to prevent device failure caused by an expansion of a through electrode and to have better reliability and improved yield, and a method of fabricating the same.

Other embodiments of the inventive concepts provide a semiconductor device configured to prevent electric characteristics of a device from being deteriorated even when a through electrode is expanded, and a method of fabricating the same.

In a semiconductor device and a method of fabricating the same according to the inventive concept, a shrinkable buffer layer may be formed to surround the through electrode, and thus, an expansion of the through electrode can be absorbed by the buffer layer. In example embodiments, the buffer layer may be formed more adjacent to the through electrode, compared with a via-insulating layer and/or a barrier layer, and thus, it is possible to prevent the via-insulating layer and/or the barrier layer from being damaged even when the through electrode is expanded.

According to example embodiments of the inventive concepts, a semiconductor device may include a substrate including a via hole penetrating therethrough, a through electrode filling the via hole, a via-insulating layer disposed between the through electrode and the substrate, and a buffer layer disposed between the through electrode and the via-insulating layer, the buffer layer being formed of a material whose shrinkability may be superior to the via-insulating layer.

In example embodiments, the buffer layer may include: tetraethylorthosilicate (TEOS) oxide; a low-k dielectric containing a SiO-based material, in which C, CH, $CH_2$, $CH_3$ or any combination thereof may be added as a ligand to have a dielectric constant smaller than the via-insulating layer; a porous layer of the low-k dielectrics provided with pores; or any combination thereof.

In example embodiments, the low-k dielectric may include octamethylcyclotetrasiloxane (OMCTS), dimethyldimethoxysilane (DMDMOS), tetramethylcyclotetrasiloxane (TMCTS), diethoxymethylsilane (DEMS), AURORA™ (ethyl 2-chloro-3-[2-chloro-4-fluoro-5-[4-(difluoromethyl)-4,5-dihydro-3-methyl-5-oxo-1H-1,2,4triazol-1-yl]phenyl] propanoat), or any combination thereof.

In example embodiments, the porous layer may include an insulating layer including the low-k dielectric, oxygen ($O_2$), and at least one of α-terpinene (ATRP) and bicycloheptadiene (BCHD).

In example embodiments, the via-insulating layer may be in contact with a sidewall of the via hole, and the buffer layer may be in contact with a sidewall of the through electrode.

In example embodiments, the buffer layer may be thinner than the via-insulating layer.

In example embodiments, the device may further include a barrier layer disposed between the via-insulating layer and the buffer layer.

In example embodiments, an interface between the through electrode and the buffer layer has an even profile substantially parallel to a longitudinal direction of the through electrode.

In example embodiments, an interface between the through electrode and the buffer layer has an uneven or curved profile along a longitudinal direction of the through electrode.

According to example embodiments of the inventive concepts, a method of fabricating a semiconductor device may include forming a via hole partially penetrating a substrate, the via hole having an entrance provided on a top surface of the substrate, forming a via-insulating layer to cover an inner surface of the via hole, forming a buffer layer on the via-insulating layer to cover the via hole provided with the via-insulating layer, the buffer layer being formed of a material whose shrinkability may be superior to the via-insulating layer, forming a through electrode to fill the via hole provided with the buffer layer, and recessing a bottom surface of the substrate to expose the through electrode.

In example embodiments, forming of buffer layer may include depositing a tetraethylorthosilicate (TEOS) layer, depositing the TEOS layer may include reacting $Si(OC_2H_5)_4$ supplied as precursor with oxygen ($O_2$) or ozone ($O_3$) supplied as reactant, at a temperature of about 20 to 400° C. and in a ratio of precursor to reactant ranging from about 1:2 to about 1:5.

In example embodiments, forming the buffer layer may include depositing a low-k dielectric having a dielectric constant smaller than the via-insulating layer, the low-k dielectric including octamethylcyclotetrasiloxane (OMCTS), dimethyldimethoxysilane (DMDMOS), tetramethylcyclotetrasiloxane (TMCTS), diethoxymethylsilane (DEMS), AURORA™ (ethyl 2-chloro-3-[2-chloro-4-fluoro-5-[4-(difluoromethyl)-4,5-dihydro-3-methyl-5-oxo-1H-1,2,4triazol-1-yl]phenyl] propanoat), or any combination thereof.

In example embodiments, forming of the buffer layer may include depositing a porous layer including the low-k dielectric, oxygen ($O_2$), and at least one of α-terpinene (ATRP) and bicycloheptadiene (BCHD).

In example embodiments, the method may further include forming a barrier layer to cover the via hole provided with the buffer layer, before forming the through electrode.

In example embodiments, exposing the through electrode may include recessing a bottom surface of the substrate to protrude a lowermost portion of the through electrode covered with the via-insulating layer and the buffer layer, forming a lower insulating layer on the recessed bottom surface of the substrate, and patterning the lower insulating layer, the via-insulating layer and the buffer layer to expose the lowermost portion of the through electrode.

In example embodiments, the method may further include at least one of forming an integrated circuit and a metal wire on the top surface of the substrate to be connected to the through electrode, and forming an upper terminal electrically connected to the through electrode via the metal wire.

In example embodiments, the method may further include forming a lower terminal on the bottom surface of the substrate to be connected to the lowermost portion of the through electrode.

In example embodiments, the buffer layer may be uniformly shrunk from an interface with the through electrode toward an interface with the via-insulating layer, such that an interface of the buffer layer and the through electrode has an even profile substantially parallel to a longitudinal direction of the through electrode.

In example embodiments, the buffer layer may be non-uniformly shrunk from an interface with the through electrode toward an interface with the via-insulating layer, such that an interface of the buffer layer and the through electrode has an uneven or curved profile along a longitudinal direction of the through electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4E through 4H are sectional views enlarging a portion of FIG. 4D.

Figure 1:
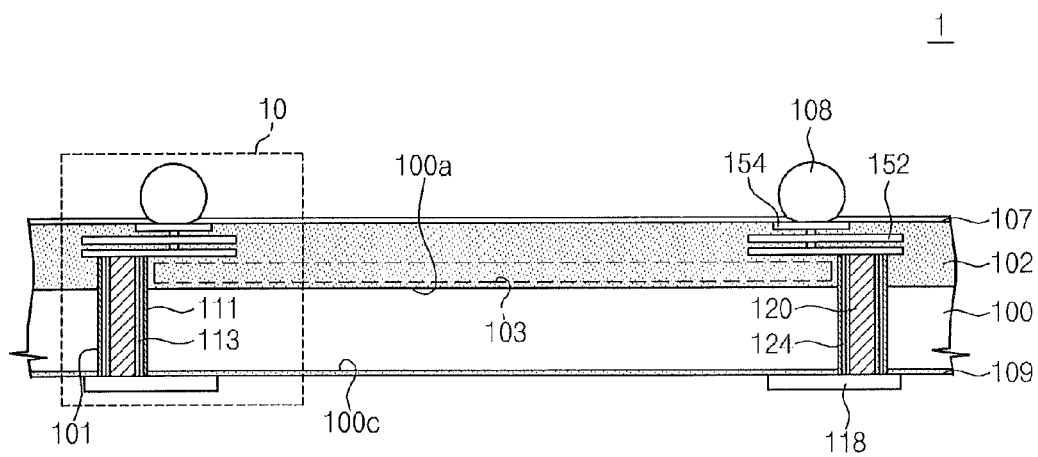
FIG. 1 is a sectional view exemplarily illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor Device

Example Embodiments

FIG. 1 is a sectional view exemplarily illustrating a semiconductor device according to example embodiments of the inventive concept.

Referring to FIG. 1, a semiconductor device 1 may include an electric connecting portion 10 vertically delivering an electrical signal. The electric connecting portion 10 may include a through electrode 120, which may be provided to fill a via hole 101 vertically penetrating a substrate 100. A via-insulating layer 111 and a buffer layer 113 may be provided between the through electrode 120 and the substrate 100. Due to the presence of the via-insulating layer 111, the through electrode 120 may be electrically isolated from the substrate 100. The buffer layer 113 may be formed of a material having a self-shrinkable property, thereby providing a space for expansion of the through electrode 120. A barrier layer 124 may be further provided to prevent constituent parts of the through electrode 120 from being diffused toward the substrate 100. The semiconductor device 1 may include at least one of an upper terminal 108 and a lower terminal 118, which are electrically connected to the through electrode 120. The upper terminal 108 may be disposed on an active surface 100a of the substrate 100 and the lower terminal 118 may be disposed on an inactive surface 100c of the substrate 100. The upper terminal 108 and the lower terminal 118 may include at least one of a solder ball, a solder bump, a redistributed line, a pad, etc. For example, the upper terminal 108 may include a solder ball and the lower terminal 118 may include a pad.

An integrated circuit 103, a metal wire 152, and an interlayered insulating layer 102 may be disposed on the active surface 100a of the substrate 100. The metal wire 152 may be electrically connected to the integrated circuit 103 and have a single-layered or multi-layered structure. The interlayered insulating layer 102 may be formed to cover the integrated circuit 103 and the metal wire 152. An upper insulating layer 107 may be provided on an interlayered insulating layer 102. The upper insulating layer 107 may be formed to expose a bonding pad 154 electrically connected with the upper terminal 108. Since the metal wire 152 and the through electrode 120 are electrically connected to each other, the integrated circuit 103 and the through electrode 120 may be electrically connected to each other. The through electrode 120 may be disposed around or in the integrated circuit 103. A lower insulating layer 109 may be disposed on the inactive surface 100c of the substrate 100 to expose the through electrode 120. The electric connecting portion 10 may be formed to have one of various structures, as will be described later with reference to FIGS. 2A through 2D.

Electric Connecting Portion

Example Embodiments

FIGS. 2A through 2D are sectional views illustrating various examples of an electric connecting portion in semiconductor devices according to example embodiments of the inventive concept.

Figure 2A:
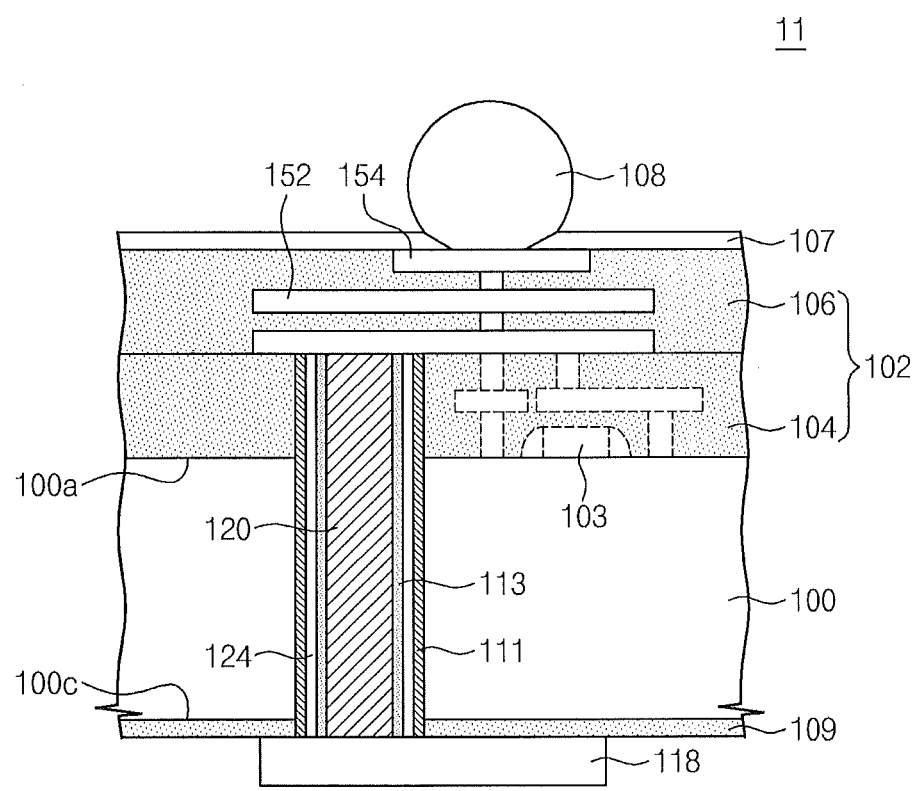
FIGS. 2A through 2D are sectional views illustrating various examples of an electric connecting portion in semiconductor devices according to example embodiments of the inventive concept.

Referring to FIG. 2A in conjunction with FIG. 1, an electric connecting portion 11 may be a via-middle structure including the through electrode 120, which may be formed after the formation of the integrated circuit 103 and before the formation of the metal wire 152. The interlayered insulating layer 102 may include a first interlayered insulating layer 104 formed on the active surface 100a of the substrate 100 to cover the integrated circuit 103 and a second interlayered insulating layer 106 formed on the first interlayered insulating layer 104 to cover the metal wire 152 and the bonding pad 154. The through electrode 120 may be electrically connected to the lower terminal 118 through the first interlayered insulating layer 104 and the substrate 100. For example, the through electrode 120 may be formed to have a pillar shape. The lower terminal 118 may be a redistribution pad electrically connecting the through electrode 120 and other terminal, which are not aligned from plan view with each other.

The via-insulating layer 111 may be disposed between the through electrode 120 and the substrate 100 to be in contact with the substrate 100. The buffer layer 113 may be provided between the via-insulating layer 111 and the through electrode 120. The buffer layer 113 may be in contact with the sidewall of the through electrode 120. In example embodiments, the buffer layer 113 may be formed of a soft insulating layer as compared with the via-insulating layer 111. For example, the buffer layer 113 may include a shrinkable layer such as an insulating layer having lower stiffness compared with the via-insulating layer 111, a low-k dielectric whose dielectric constant is lower than the via-insulating layer 111, a porous layer, or any combination thereof.

In example embodiments, the via-insulating layer 111 may include a silicon oxide layer (e.g., $SiO_2$) having a dielectric constant of about 3.9. The buffer layer 113 may include tetraethylorthosilicate (TEOS) oxide having more pores than $SiO_2$, a low-k dielectric containing a SiO-based material, in which C, CH, $CH_2$, $CH_3$ or any combination thereof is added as a ligand and thereby having a dielectric constant of about 3.0 or less, or a porous layer of the low-k dielectric material provided with many pores.

In example embodiments, the low-k dielectric may include octamethylcyclotetrasiloxane (OMCTS), dimethyldimethoxysilane (DMDMOS), tetramethylcyclotetrasiloxane (TMCTS), diethoxymethylsilane (DEMS), ethyl 2-chloro-3-[2-chloro-4-fluoro-5-[4-(difluoromethyl)-4,5-dihydro-3-methyl-5-oxo-1H-1,2,4triazol-1-yl]phenyl]propanoat (AURORA™), or any combination thereof, but example embodiments of the inventive concepts may not be limited thereto. The porous layer may be a layer formed of at least one of combinations of at least one of the low-k dielectrics (e.g., DEMS), oxygen ($O_2$), and at least one of α-terpinene (ATRP) and bicycloheptadiene (BCHD).

The through electrode 120 may be expanded by a thermal stress, which may result from a process of forming the through electrode 120 and/or an operation of the semiconductor device 1. According to example embodiments of the inventive concept, due to the soft property (e.g., shrinkability) of the buffer layer 113, the through electrode 120 may be more expanded in a lateral direction (i.e., toward the buffer layer 113) of the through electrode 120 than in a longitudinal direction of the through electrode 120. Since the expansion is dominant in the lateral direction, it is possible to suppress or prevent the through electrode 120 from being expanded or protruded along the longitudinal direction thereof.

The through electrode 120 may include polysilicon or metal (e.g., of tungsten, aluminum, copper). In the case in which the through electrode 120 is formed of a metal with high diffusivity (e.g., copper), diffusion of the high-diffusivity metal (e.g., copper) into the substrate 100 and/or the integrated circuit 103 may lead to deterioration in electric characteristics of the semiconductor device 1. According to example embodiments of the inventive concept, the semiconductor device 1 may further include the barrier layer 124 capable of preventing constituent elements (e.g., copper) of the through electrode 120 from being diffused. In example embodiments, the barrier layer 124 may be provided to surround the through electrode 120. In the case in which the barrier layer 124 is provided between the through electrode 120 and the buffer layer 113, the barrier layer 124 may be damaged by the expansion of the through electrode 120, thereby allowing the metallic element (e.g., copper) to diffuse into the substrate 100 and/or the integrated circuit 103 via the damaged portion. To avoid this problem, according to example embodiments of the inventive concept, the barrier layer 124 may be interposed between the buffer layer 113 and the via-insulating layer 111, and this may prevent the barrier layer 124 from being damaged even when the through electrode 120 is expanded. The barrier layer 124 may be configured to serve as an adhesion layer improving an adhesive property between the through electrode 120 and the via-insulating layer 111.

Figure 2B:
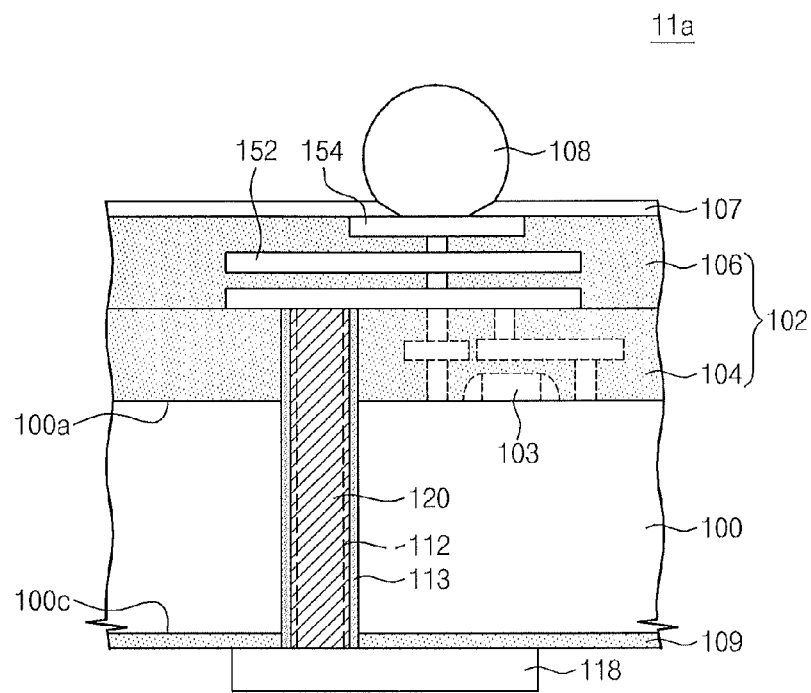

Referring to FIG. 2B, as a different example of the electric connecting portion 11 of the via-middle structure of FIG. 2A, an electric connecting portion 11a may be configured so as not to have the barrier layer 124 between the through electrode 120 and the substrate 100, when the through electrode 120 is formed of, for example, a conductive layer (e.g., polysilicon tungsten or aluminum) other than copper. Since the buffer layer 113 is formed of an insulating material, the via-insulating layer 111 may be not formed in the electric connecting portion 11a. The buffer layer 113 may have a thickness greater than, for example, the via-insulating layer 111 of FIG. 2A in consideration of a shrinkage to be caused at least by the expansion of the through electrode 120 and be formed of an oxide material in consideration of an electric isolation property between the through electrode 120 and the substrate 100. An adhesion layer 112 may be further disposed between the buffer layer 113 and the through electrode 120. For example, the adhesion layer 112 may include the same or similar material as the barrier layer 124 of FIG. 2A. The present embodiment may be applied to the via-last structure and the via-first structure to be described below, in the same or similar manner.

Figure 2C:
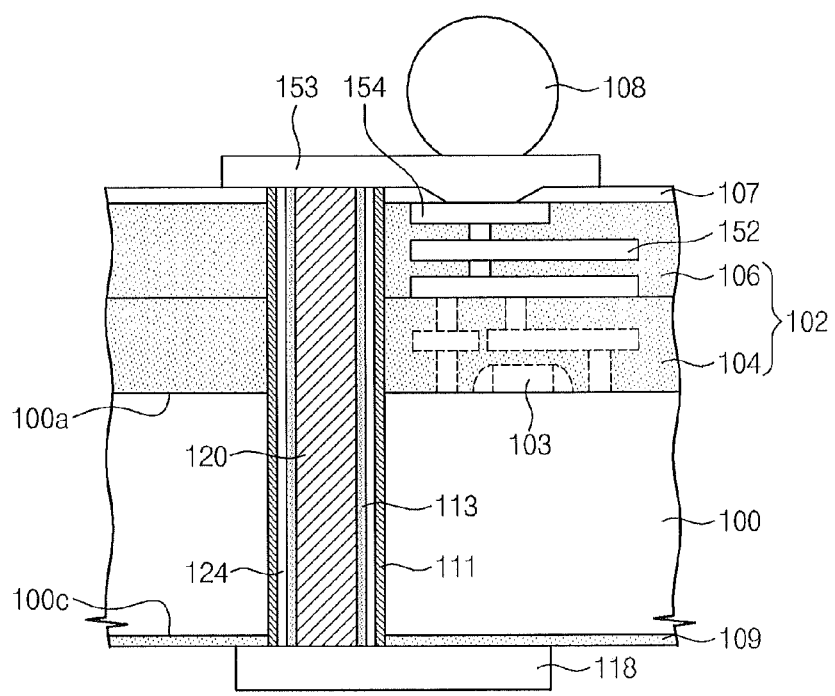

Referring to FIG. 2C, an electric connecting portion 12 may be a via-last structure including the through electrode 120, which may be formed after the formation of the integrated circuit 103 and the metal wire 152. The through electrode 120 may be formed to have a pillar shape penetrating the interlayered insulating layer 102 and the substrate 100. An upper interconnection line 153 may be further provided on the upper insulating layer 107 to connect the through electrode 120 and the bonding pad 154 electrically with each other. The through electrode 120 may be connected to the upper interconnection line 153 through the upper insulating layer 107.

Figure 2D:
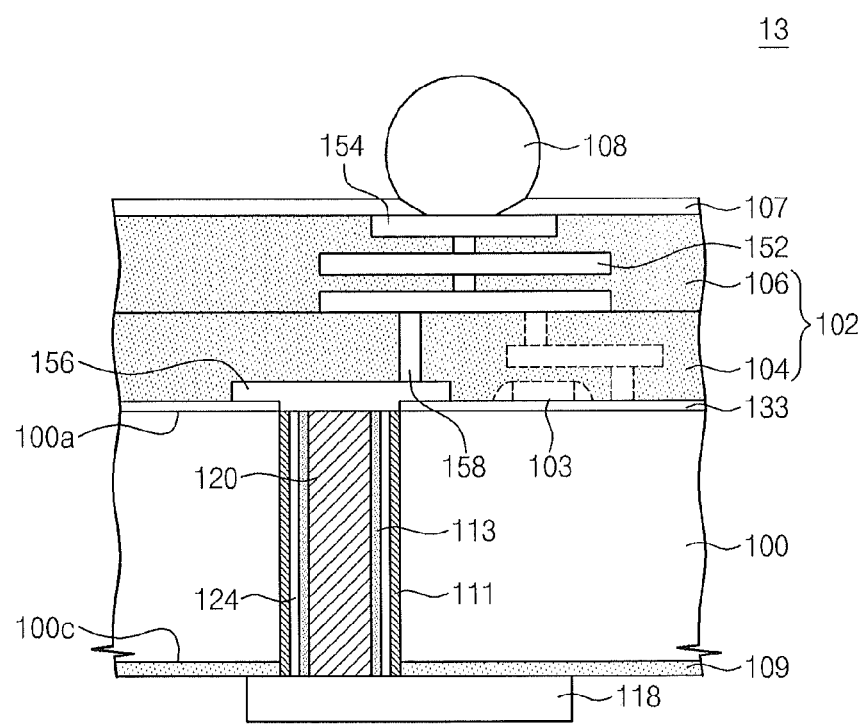

Referring to FIG. 2D, an electric connecting portion 13 may be a via-first structure including the integrated circuit 103 and the metal wire 152, which may be formed after the formation of the through electrode 120. A connecting line 156 may be further provided on the active surface 100a of the substrate 100 and be electrically connected to the through electrode 120 with an insulating layer 133 interposed therebetween. In example embodiments, the through electrode 120 may be shaped like a pillar penetrating the substrate 100 and be electrically connected to the metal wire 152 and/or the integrated circuit 103 via a connecting via 158 connecting the connecting line 156 to the metal wire 152.

An Example of Semiconductor Package

Figure 3:
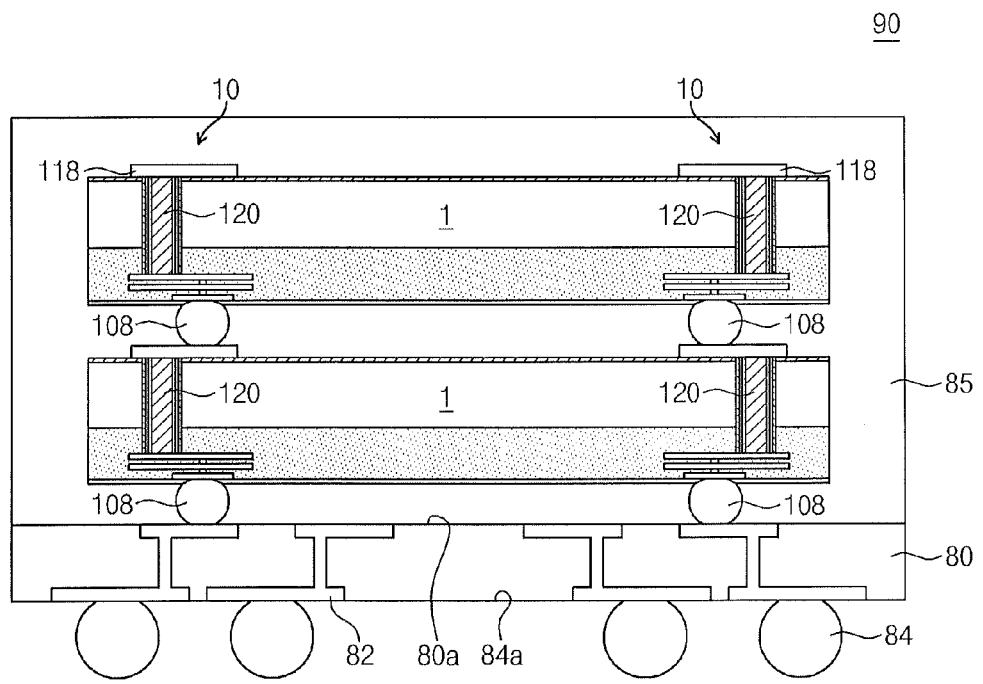
FIG. 3 is a sectional view illustrating a semiconductor package, in which the semiconductor device of FIG. 1 is packaged.

FIG. 3 is a sectional view illustrating a semiconductor package, in which the semiconductor device of FIG. 1 is packaged.

Referring to FIG. 3, a semiconductor package 90 may include a package substrate 80 and at least one of the semiconductor devices 1 of FIG. 1 mounted on the package substrate 80. The semiconductor package 90 may further include a molding layer 85 molding the semiconductor devices 1. The package substrate 80 may include a top surface 80a and a bottom surface 80b facing each other and, in example embodiments, it may be a printed circuit board provided with electric connection lines 82. The semiconductor devices 1 may be mounted on the top surface 80a of the package substrate 80, for example, in a face-down manner, such that the active surface 100a may face the package substrate 80. In other embodiments, the semiconductor devices 1 may be mounted on the top surface 80a of the package substrate 80, for example, in a face-up manner. The semiconductor package 90 may further include at least one solder ball 84 attached to the bottom surface 80b of the package substrate 80 and connected to the electric connection line 82. In example embodiments, electric connections between the semiconductor devices 1 and between the semiconductor devices 1 and the package substrate 80 may be accomplished using the through electrodes 120. The semiconductor devices 1 may be configured to include at least one of the electric connecting portions 10, 10a, 11, 12, and 13 to be described in the present specification.

Fabrication Method

Example Embodiments

FIGS. 4A through 4K are sectional views exemplarily illustrating a method of fabricating a semiconductor device according to example embodiments of the inventive concept.

Figure 4A:
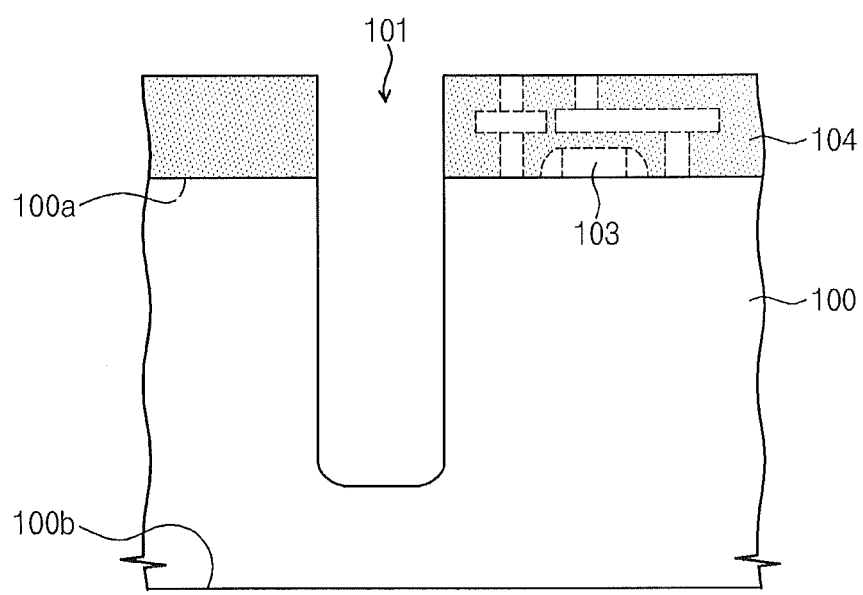
FIGS. 4A through 4K are sectional views exemplarily illustrating a method of fabricating a semiconductor device according to example embodiments of the inventive concept.

Referring to FIG. 4A, the via hole 101 may be formed on the substrate 100. The substrate 100 may be a semiconductor substrate (for example, a silicon substrate) having the top surface 100a provided with the integrated circuit 103 and a first bottom surface 100b facing each other. The first interlayered insulating layer 104 may be formed on the top surface 100a of the substrate 100 to cover the integrated circuit 103. The integrated circuit 103 may be configured to include a memory circuit, a logic circuit, or a combination thereof. The first interlayered insulating layer 104 may be formed by depositing a silicon oxide layer or a silicon nitride layer. The via hole 101 may be formed to have a hollow pillar shape having an entrance near the top surface 100a of the substrate 100 but having such a depth as not to penetrate the first bottom surface 100b. The via hole 101 may extend from the top surface 100a of the substrate 100 toward the first bottom surface 100b in a substantially vertical direction. The via hole 101 may be formed by performing a dry etching process or a drilling process on the first interlayered insulating layer 104 and the substrate 100. In example embodiments, the via hole 101 may be formed near the integrated circuit 103 (for example, a scribe lane or a region adjacent thereto) or at a region provided with the integrated circuit 103.

Figure 4B:
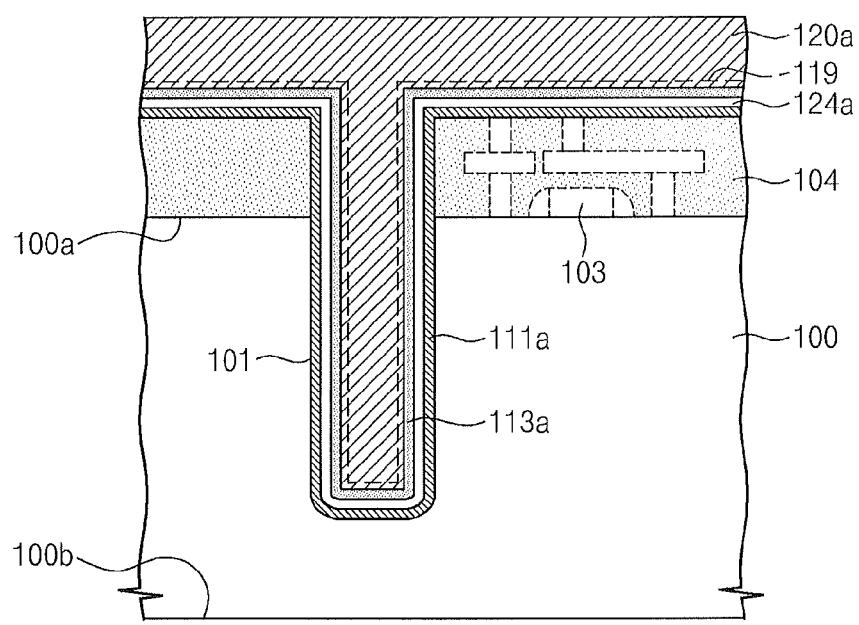

Referring to FIG. 4B, a first insulating layer 111a and a second insulating layer 113a may be sequentially formed to cover an inner wall of the via hole 101, and then a conductive layer 120a may be formed on the substrate 100 to fill the via hole 101. The first insulating layer 111a may include a silicon oxide layer or a silicon nitride layer, which may be formed using, for example, a chemical vapor deposition process. The second insulating layer 113a may be formed by depositing an insulating material having a softness greater than the first insulating layer 111a on the first insulating layer 111a to cover the resultant structure provided with the first insulating layer 111a. As exemplary embodiments, at least one of the first insulating layer 111a and a second insulating layer 113a may be formed conformally cover the inner wall of the via hole 101.

For example, the second insulating layer 113a may include a TEOS layer, which may be formed by reacting $Si(OC_2H_5)_4$ supplied as a precursor with oxygen ($O_2$) or ozone ($O_3$) supplied as a reactant at a temperature of about 20 to 400° C. In the step of forming the TEOS layer, a ratio of precursor to reactant may range from about 1:2 to about 1:5.

In other embodiments, the second insulating layer 113a may be a low-k dielectric formed using an organic material as a precursor, where the organic material may be a SiO-based material, in which C, CH, $CH_2$, $CH_3$ or any combination thereof is added as ligand. For example, the low-k dielectric may include octamethylcyclotetrasiloxane (OMCTS), dimethyldimethoxysilane (DMDMOS), tetramethylcyclotetrasiloxane (TMCTS), diethoxymethylsilane (DEMS), AURORA™ (ethyl 2-chloro-3-[2-chloro-4-fluoro-5-[4-(difluoromethyl)-4,5-dihydro-3-methyl-5-oxo-1H-1,2,4triazol-1-yl]phenyl]propanoat), or any combination thereof.

In still other example embodiments, the second insulating layer 113a may include a porous low-k dielectric formed by adding a porogen such as α-terpinene (ATRP) or bicycloheptadiene (BCHD), which may produce pores in a layer, into the organic material.

The conductive layer 120a may be formed by depositing or plating a layer of polysilicon, copper, tungsten, aluminum, and so forth. In the case in which the conductive layer 120a is formed of a copper layer or a copper-containing conductive material, a metal layer 124a capable of preventing copper diffusion may be formed on the insulating layer 111a before the formation of the second insulating layer 113a. The metal layer 124a may be formed by depositing a metal layer containing at least one of titanium, titanium nitride, chromium, tantalum, tantalum nitride, nickel, or any combination thereof. In the case the conductive layer 120a is formed using a plating process, a seed layer 119 may be further formed on the second insulating layer 113a before the formation of the conductive layer 120a.

Figure 4C:
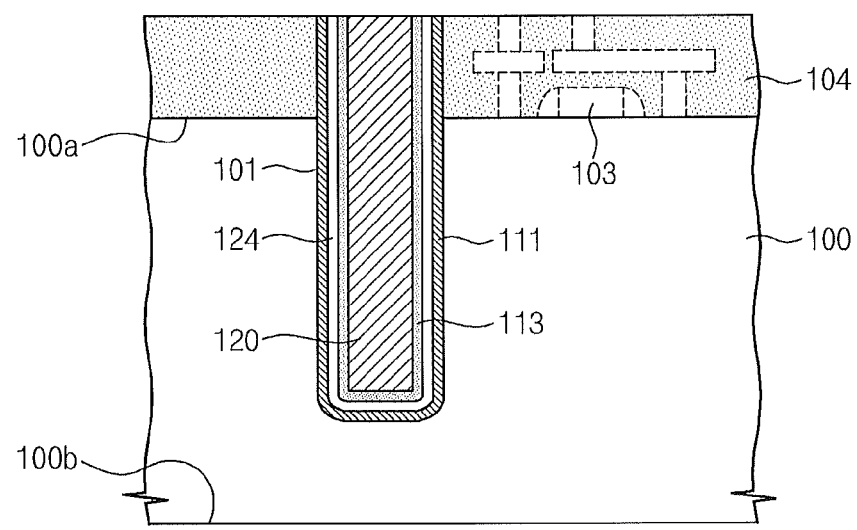

Referring to FIG. 4C, planarization may be performed to expose the first interlayered insulating layer 104. The planarization may include etching the conductive layer 120a, the second insulating layer 113a, the metal layer 124a, and the first insulating layer 111a in an etch-back or chemical-mechanical polishing (CMP) manner. As the result of the planarization of the conductive layer 120a, the through electrode 120 may be formed to extend vertically along the via hole 101. In addition, as the result of the planarization, the second insulating layer 113a may be transformed into the buffer layer 113, the first insulating layer 111a may be changed into the via-insulating layer 111 to surround the through electrode 120, and the metal layer 124a may be formed into the barrier layer 124 provided between the buffer layer 113 and the via-insulating layer 111.

Figure 4D:
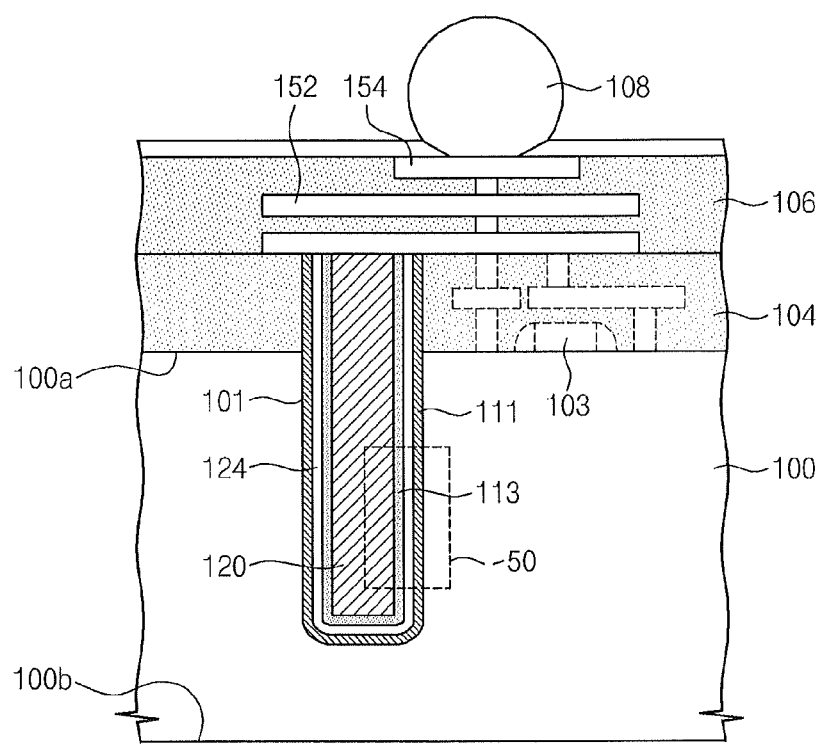

Referring to FIG. 4D, a back-end process may be performed. For example, the metal wire 152 of single- or multi-layered structure coupled to the through electrode 120, the bonding pad 154 electrically connected to the metal wire 152, and the second interlayered insulating layer 106 covering the metal wire 152 and the bonding pad 154 may be formed on the first interlayered insulating layer 104. The metal wire 152 and the bonding pad 154 may be formed by depositing and patterning a metal layer (e.g., of copper or aluminum). The second interlayered insulating layer 106 may be formed by depositing an insulating material (e.g., of silicon oxide or silicon nitride), for example, using a CVD. In example embodiments, the second interlayered insulating layer 106 may be formed of the same or similar material as the first interlayered insulating layer 104. The upper insulating layer 107 may be formed on the second interlayered insulating layer 106. The upper insulating layer 107 may be formed by depositing a layer (e.g., of silicon oxide, silicon nitride, or polymer) and patterning the layer to expose the bonding pad 154. In example embodiments, a bump process may be further performed to form the upper terminal 108 (e.g., a solder ball or a solder bump) coupled to the bonding pad 154.

The back-end process may accompany a thermal step. For example, a thermal step may be needed to form the metal wire 152. Such a thermal step may result in a thermal stress causing a thermal expansion of the through electrode 120. For example, the through electrode 120 may be expanded during the thermal step to protrude over the first interlayered insulating layer 104. The protrusion of the through electrode 120 may lead to a failure in electric connection between the through electrode 120 and the metal wire 152. For example, the protrusion of the through electrode 120 may lead to an increase in contact resistance between the through electrode 120 and the metal wire 152 and/or delamination of the metal wire 152. In addition, a lateral expansion of the through electrode 120 may lead to technical problems, such as deformation or breakage of the via-insulating layer 111 and/or the barrier layer 124. However, according to example embodiments of the inventive concept, the afore-described problems can be suppressed or prevented by the buffer layer 113 absorbing the expansion of the through electrode 120, as will be described later with reference to FIGS. 4E through 4H.

FIGS. 4E through 4H are sectional views enlarging a portion 50 of FIG. 4D.

Figure 4E:
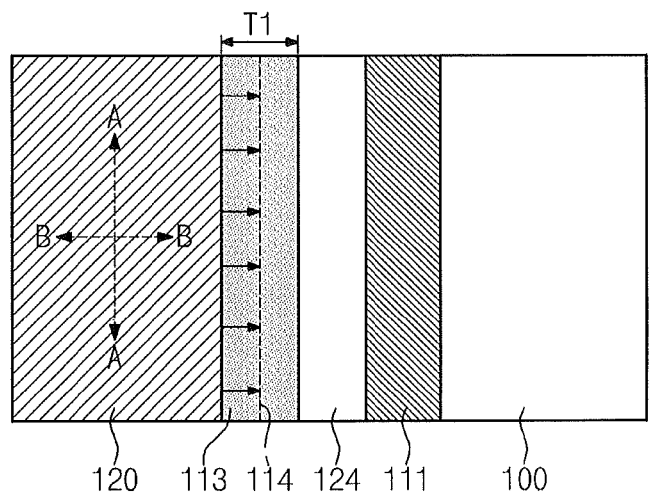
Figure 4F:
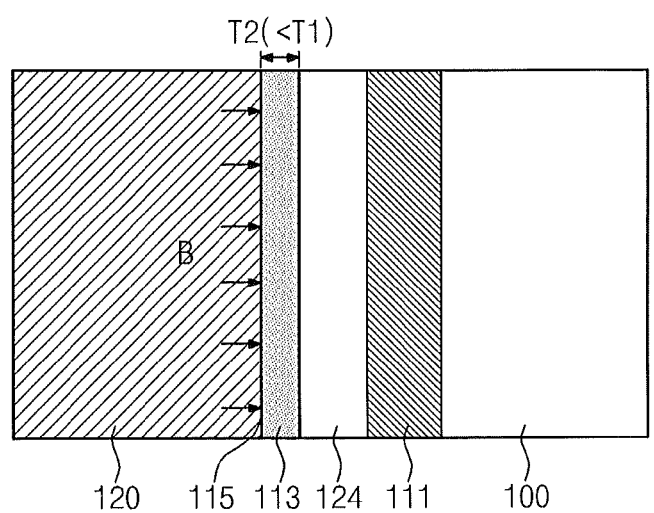

As shown in FIG. 4E, the through electrode 120 may be expanded in all directions by a thermal stress applied thereto. For the sake of simplicity, the expansion of the through electrode 120 in two major directions (a longitudinal direction A and a lateral direction B will be considered. Due to the presence of the shrinkable buffer layer 113, the through electrode 120 may be expanded in the lateral direction B. In other words, the buffer layer 113 may be decreased in a direction toward the substrate 100 by its own shrinkable property and the expansion of the through electrode 120. As a result, as shown in FIG. 4F, the through electrode 120 may be mainly expanded in the lateral direction B, and thus, a longitudinal expansion and a protruding thereof can be suppressed or reduced. The shrinkage of the buffer layer 113 may result in a reduction in thickness of the buffer layer 113, i.e., T1→T2. According to example embodiments of the inventive concept, the buffer layer 113 may have a thickness less than that of the via-insulating layer 111. In other embodiments, the buffer layer 113 may have a thickness equivalent to or greater than that of the via-insulating layer 111.

In example embodiments, the barrier layer 124 disposed between the buffer layer 113 and the substrate 100 may be a metal layer and thus be not be affected by the shrinkage of the buffer layer 113. And, the barrier layer 124 may be interposed between the via-insulating layer 111 and the buffer layer 113, and thus the via-insulating layer 111 may not be affected by the shrinkage of the buffer layer 113. In the case of the absence of the barrier layer 124, the via-insulating layer 111 may be formed of a material exhibiting hardness greater than the buffer layer 113, and thus, it is possible to reduce technical problems (shrinkage, deformation, or breakage of the via-insulating layer 111) caused by the shrinkage of the buffer layer 113. As a result, the barrier layer 124 and/or the via-insulating layer 111 can preserve their own properties.

In the case in which the expansion of the through electrode 120 and/or the shrinkage of the buffer layer 113 are uniform, a shrinking surface 114 of the buffer layer 113 may have an even profile substantially parallel to the longitudinal direction of the through electrode 120. Accordingly, an interface 115 between the buffer layer 113 and the through electrode 120 may be substantially parallel to the longitudinal direction of the through electrode 120.

Figure 4G:
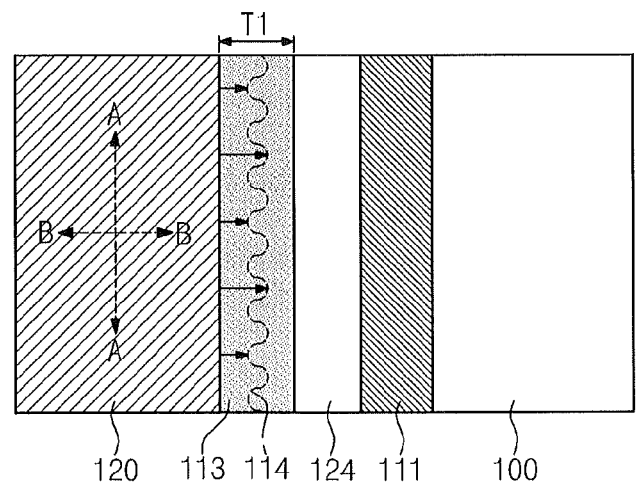
Figure 4H:
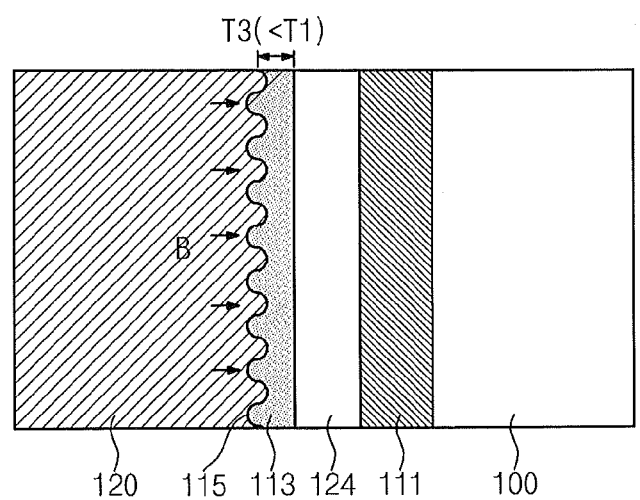

In other embodiments, as shown in FIG. 4G, in the case in which the expansion of the through electrode 120 and/or the shrinkage of the buffer layer 113 are non-uniform, the shrinking surface 114 of the buffer layer 113 may be formed to have an uneven profile. Accordingly, as shown in FIG. 4H, the interface 115 between the buffer layer 113 and the through electrode 120 may have an uneven or curved profile along the longitudinal direction of the through electrode 120. The buffer layer 113 may have a reduced thickness (i.e., T1→T3), due to the shrinkage thereof.

Figure 4I:
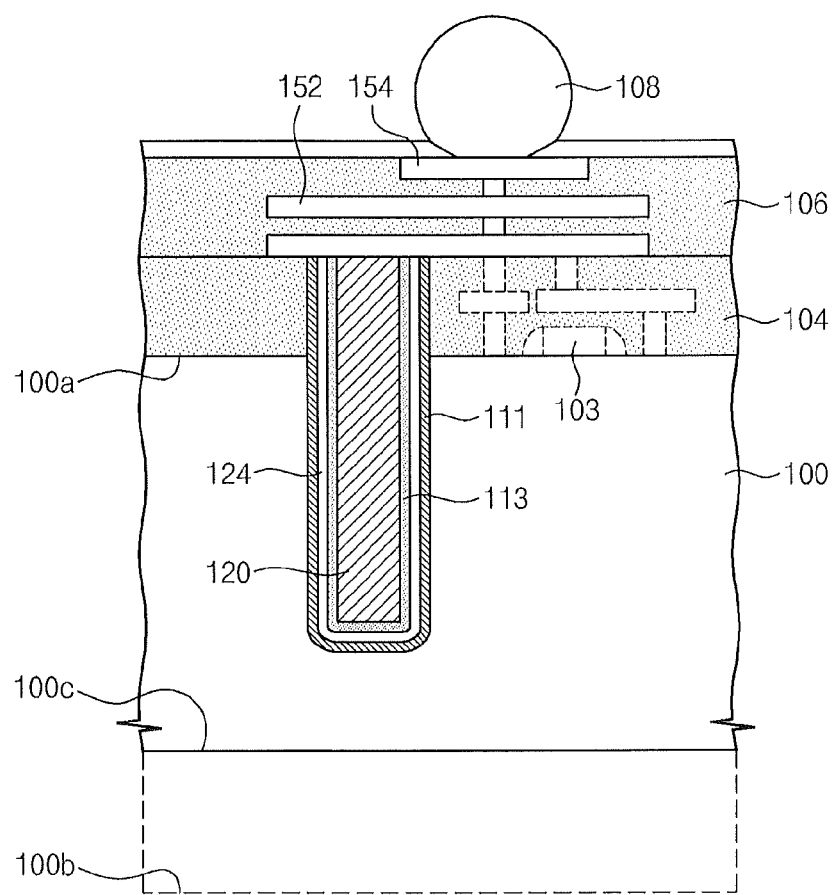

Referring to FIG. 4I, the substrate 100 may be recessed. For example, the first bottom surface 100*b* of the substrate 100 may be recessed using at least one of an etching process, a CMP process, a grinding process, or any combination thereof with an etchant capable of selectively etching the substrate 100. The recess of the substrate 100 may be performed in such a way that the through electrode 120 protrudes from the second bottom surface 100*c*. Although the through electrode 120 may be protruded outward from the second bottom surface 100*c* of the substrate 100, the through electrode 120 may be surrounded by the triple layers (i.e., of the via-insulating layer 111, the barrier layer 124, and the buffer layer 113) and not be exposed to the outside. This may prevent the through electrode 120 from being contaminated or particles from occurring. In the present specification, the top surface 100*a* and the second bottom surface 100*c* of the substrate 100 may correspond to the active and inactive surfaces of the substrate 100, respectively.

Figure 4J:
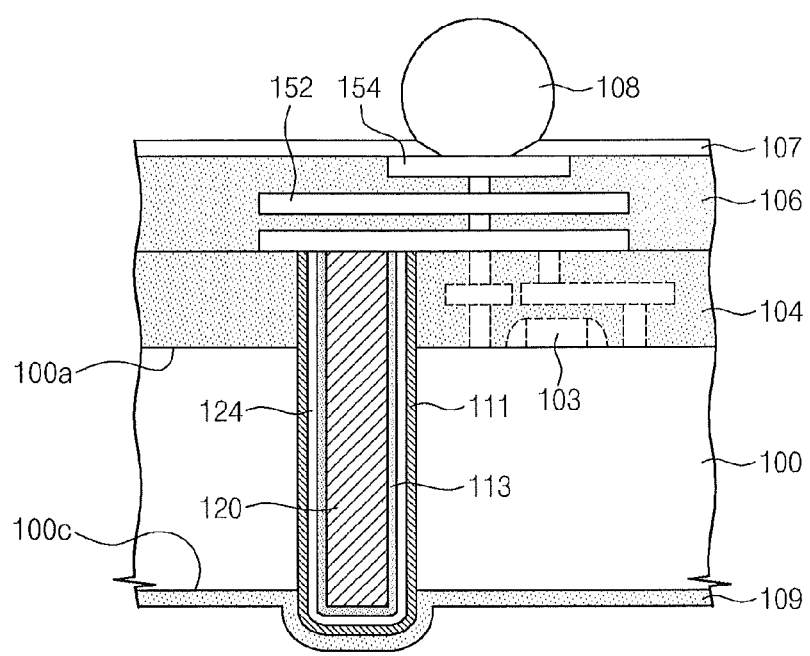

Referring to FIG. 4J, the lower insulating layer 109 may be formed on the second bottom surface 100*c* of the substrate 100. The lower insulating layer 109 may be a silicon oxide layer, a silicon nitride layer or a polymer, which may be formed using, for example, a chemical vapor deposition. The lower insulating layer 109 may cover the second bottom surface 100*c* of the substrate 100 and the via-insulating layer 111. The lower insulating layer 109, the via-insulating layer 111, the barrier layer 124, and the buffer layer 113 may be planarized using at least one of a polishing process, a grinding process, or an etching process to expose the through electrode 120.

Figure 4K:
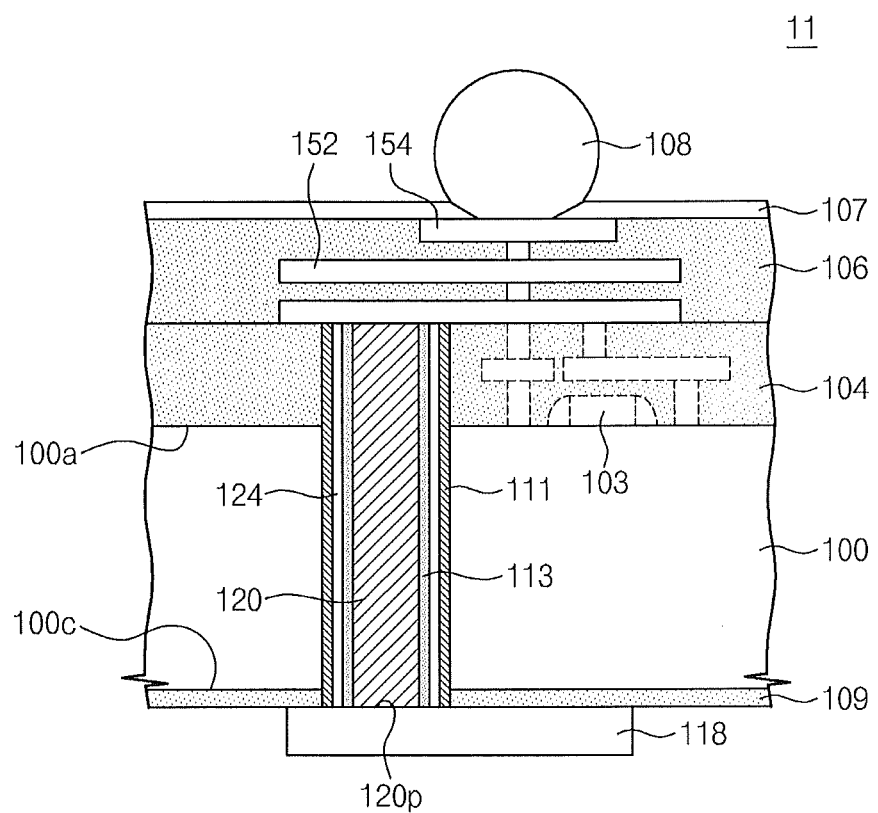

Referring to FIG. 4K, a lowermost portion 120*p* of the through electrode 120 may be exposed as the result of the planarization. The lower terminal 118 may be formed on the planarized lower insulating layer 109 and be connected to the lowermost portion 120*p* of the through electrode 120. The lower terminal 118 may be provided in a form of redistributed pad or a solder ball. As the result of the afore-described processes, the semiconductor device 1 of FIG. 1 may be configured to include the electric connecting portion 11 having the via-middle structure of FIG. 2A (i.e., to include the through electrode 120 surrounded by the buffer layer 113).

In other embodiments, the through electrode 120 may be formed after forming the integrated circuit 103 and a metal wire 152, and in this case, the semiconductor device 1 may be fabricated to include the electric connecting portion 12 having the via-last structure of FIG. 2C. In still other embodiments, the integrated circuit 103 and the metal wire 152 may be sequentially formed after the formation of the through electrode 120, and in this case, the semiconductor device 1 may be fabricated to include the electric connecting portion 13 having the via-first structure of FIG. 2D.

Fabricating Method

Other Embodiments

Figure 5A:
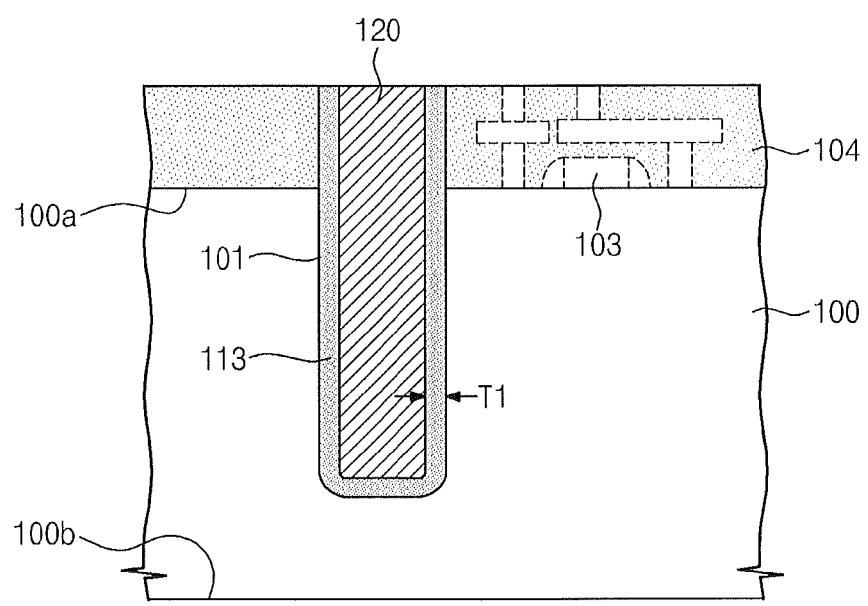
FIGS. 5A through 5C are sectional views exemplarily illustrating a method of fabricating a semiconductor device according to other example embodiments of the inventive concept.
Figure 5B:
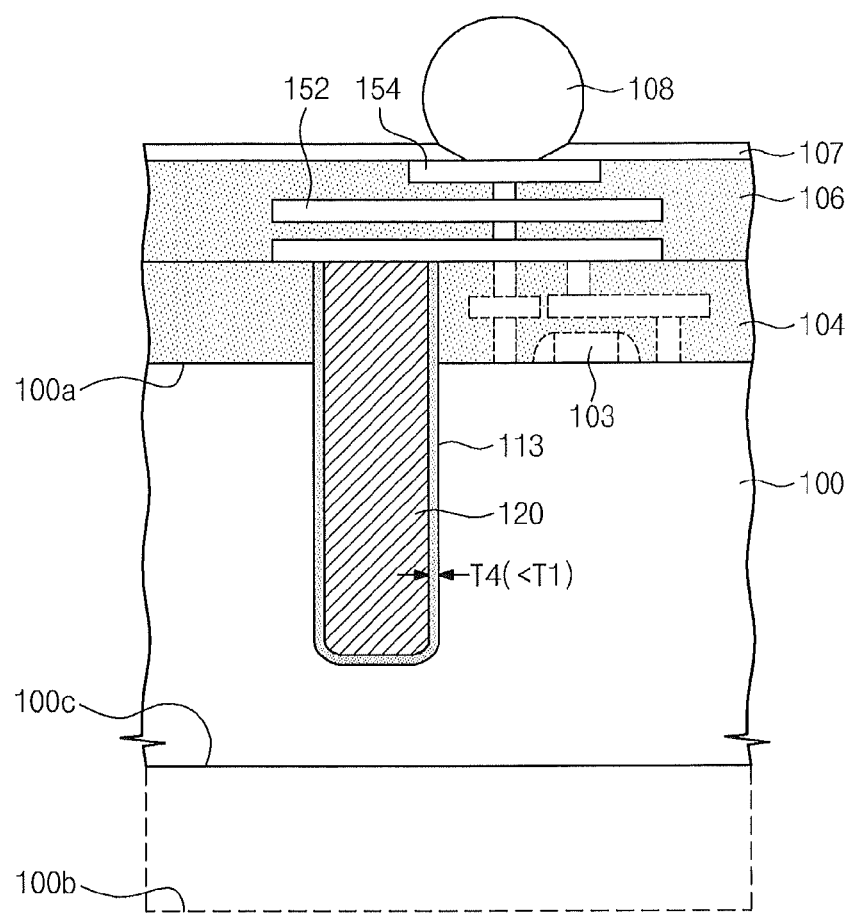
Figure 5C:
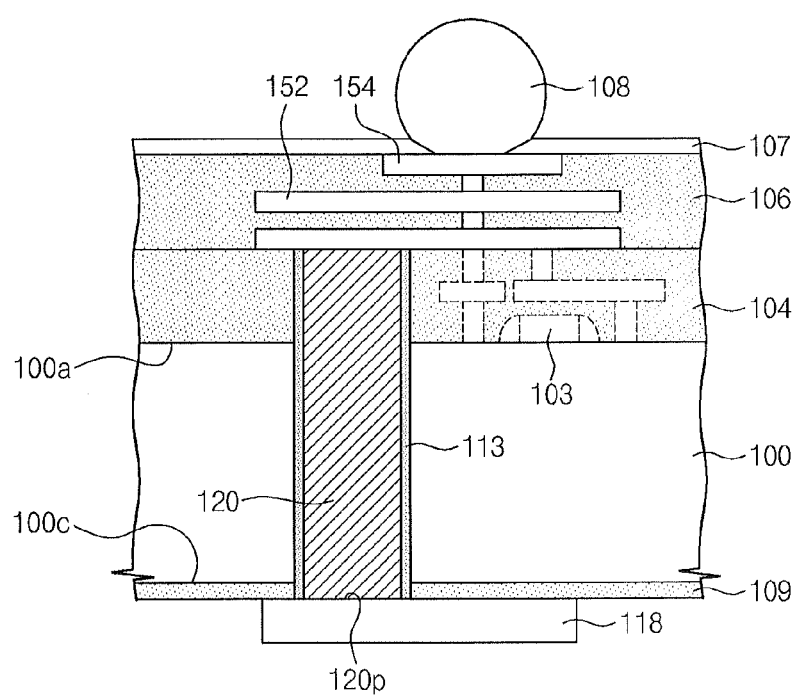

FIGS. 5A through 5C are sectional views exemplarily illustrating a method of fabricating a semiconductor device according to other example embodiments of the inventive concept.

Referring to FIG. 5A, using the process similar or identical to the previous embodiments described with reference to FIGS. 4A through 4C, the buffer layer 113 may be formed to extend along the inner wall of the via hole 101 and the through electrode 120 may be formed to fill the via hole 101. For example, the via hole 101 may be formed in the substrate 100, an insulating layer may be formed to cover conformally the inner wall of the via hole 101, a conductive layer may be formed to fill the via hole 101 provided with the insulating layer, and then the resultant structure may be planarized to form the buffer layer 113 and the through electrode 120. The integrated circuit 103 and the first interlayered insulating layer 104 may be formed on the top surface 100a of the substrate 100. The buffer layer 113 may be formed of a shrinkable and soft insulating material. As a result, the buffer layer 113 may contribute to absorption of the expansion of the through electrode 120 as well as to serve as a via-insulating layer. The buffer layer 113 may be formed to have an initial thickness of T1. The through electrode 120 may be formed by depositing or plating a layer of polysilicon, tungsten, or aluminum. According to example embodiments of the inventive concept, the through electrode 120 may not be formed of a high-diffusivity metal (e.g., of copper). In this case, a process of forming the barrier layer may be omitted.

Referring to FIG. 5B, the back-end process and the recess process may be performed. As an example of the back-end process, a process similar or identical to the previous embodiments described with reference to FIG. 4D may be performed to form the metal wire 152 on the first interlayered insulating layer 104 to be connected to the through electrode 120, to form the bonding pad 154 connected to the metal wire 152, and to form the second interlayered insulating layer 106 covering the metal wire 152 and the bonding pad 154. The upper insulating layer 107 may be formed on the second interlayered insulating layer 106, and the upper terminal 108 may be formed to be connected to the bonding pad 154. A thermal stress in a process of forming the metal wire 152 may result in an expansion of the through electrode 120, and due to the expansion of the through electrode 120 and its own shrinkable property, the buffer layer 113 may be shrunk to have a thickness T4 smaller than its initial thickness T1 (i.e., T4<T1). As an example of the recess process, a process similar or identical to the previous embodiments described with reference to FIG. 4I may be performed to recess the first bottom surface 100b of the substrate 100. As the result of the recess process, the second bottom surface 100c may be exposed and the through electrode 120 may be protruded outward.

Referring to FIG. 5C, similar or identical to the previous embodiments described with reference to FIGS. 4J and 4K, the lower insulating layer 109 may be formed on the second bottom surface 100c of the substrate 100 and be planarized to expose the lowermost portion 120p of the through electrode 120. The lower terminal 118 may be formed on the lower insulating layer 109 and be connected to the lowermost portion 120p of the exposed through electrode 120. As shown in FIG. 2B, the adhesion layer 112 may be further formed between the through electrode 120 and the buffer layer 113. As the result of the afore-described processes, the semiconductor device 1 of FIG. 1 may be configured to include the electric connecting portion 11a having the via-middle structure of FIG. 2B. The embodiment described here may be applied to form the via-last structure of FIG. 2C and the via-first structure of FIG. 2D.

Applications of Embodiments

Figure 6A:
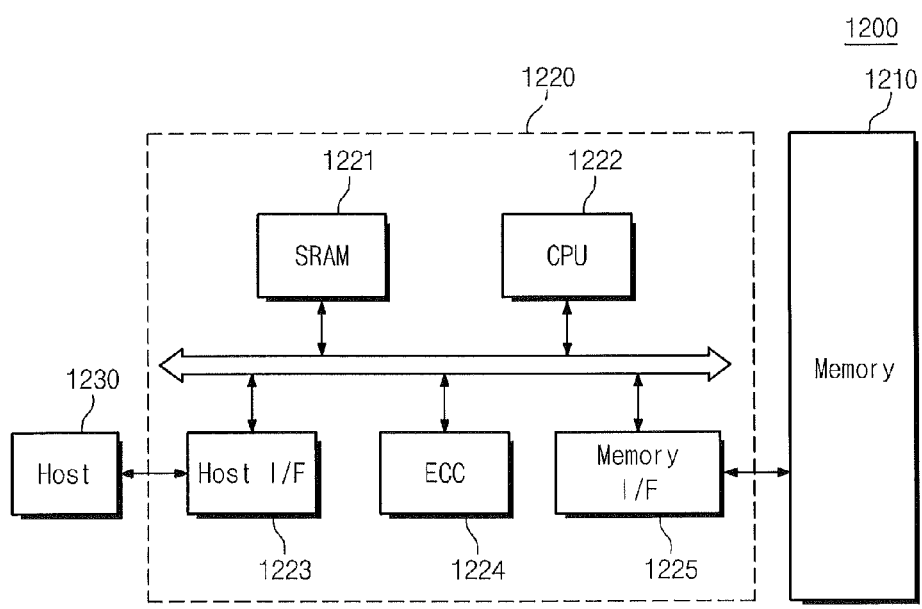
FIG. 6A is a block diagram of a memory card including a semiconductor device according to example embodiments of the inventive concept.
Figure 6B:
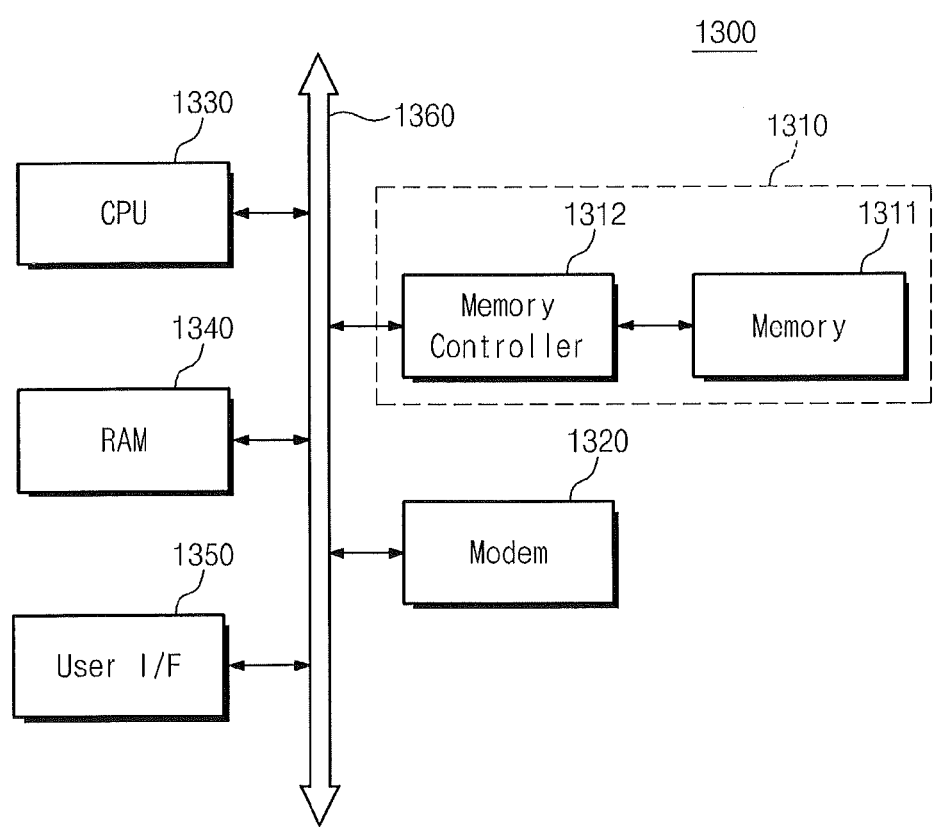
FIG. 6B is a block diagram of an information processing system including a semiconductor device according to example embodiments of the inventive concept.

FIG. 6A is a block diagram of a memory card including a semiconductor device according to example embodiments of the inventive concept. FIG. 6B is a block diagram of an information processing system including a semiconductor device according to example embodiments of the inventive concept.

Referring to FIG. 6A, a memory card 1200 may include a memory controller 1220 controlling general data exchanges between a host and a memory device 1210. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processing unit 1222 may perform general control operations for data exchange of the memory controller 1220. The memory device 1210 may include at least one of the semiconductor device 1 and the semiconductor packages 90 according to example embodiments of the inventive concept.

Referring to FIG. 6B, information processing system 1300 may be realized using a memory system 1310 including at least one of the semiconductor device 1 and the semiconductor packages 90 according to example embodiments of the inventive concept. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 6A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concept.

According to example embodiments of the inventive concept, the buffer layer is formed of a shrinkable material capable of absorbing an expansion of the through electrode, thereby preventing or suppressing a protrusion issue caused by an expansion of the through electrode. Furthermore, this may prevent a process failure caused by the protrusion of the through electrode, and thus, it is possible to improve electric characteristics, reliability or yield of the device. In addition, the presence of the buffer layer may suppress or prevent the via-insulating layer and/or the barrier layer from being damaged by an expansion of the through electrode. In other words, the via-insulating layer and/or the barrier layer can preserve their own properties, thereby preventing electric characteristics of the device from being deteriorated.

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor device, comprising:
   a substrate including a via hole therethrough;
   a through electrode filling the via hole;
   a via-insulating layer disposed between the through electrode and the substrate; and
   a buffer layer disposed between the through electrode and the via-insulating layer, the buffer layer being formed of a material whose shrinkability is superior to the via-insulating layer and the buffer layer includes tetraethylorthosilicate (TEOS) oxide; low-k dielectric containing a SiO-based material, in which C, CH, $CH_2$, or $CH_3$ or any combination thereof is added as a ligand; or a porous layer of the low-k dielectrics; or any combination thereof, wherein the low-k dielectric comprises octamethylcyclotetrasiloxane (OMCTS), dimethyldimethoxysilane (DMDMOS), tetramethylcyclotetrasiloxane (TMCTS), diethoxymethylsilane (DEMS), or AURORA™ (ethyl 2-chloro-3-[2-chloro-4-fluoro-5-[4-(difluoromethyl)-4,5-dihydro-3-methyl-5-oxo-1H-1,2,4-triazol-1-yl]phenyl]propanoat), or any combination thereof, and the porous layer comprises an insulating layer including the low-k dielectric, oxygen ($O_2$), and at least one of α-terpinene (ATRP) and bicycloheptadiene (BCHD).

2. The device of claim 1, wherein the via-insulating layer is in contact with a sidewall of the via hole, and the buffer layer is in contact with a sidewall of the through electrode.

3. The device of claim 1, wherein the buffer layer has a thickness that is less than the thickness of the via-insulating layer.

4. The device of claim 1, further comprising a barrier layer disposed between the via-insulating layer and the buffer layer.

5. The device of claim 1, wherein an interface between the through electrode and the buffer layer has an even profile substantially parallel to a longitudinal direction of the through electrode.

6. The device of claim 1, wherein an interface between the through electrode and the buffer layer has an uneven or curved profile along a longitudinal direction of the through electrode.

* * * * *